Jan. 19, 1960
R. W. FRITTS ET AL
2,922,082
LOW VOLTAGE CONTROL APPARATUS
Filed July 12, 1954
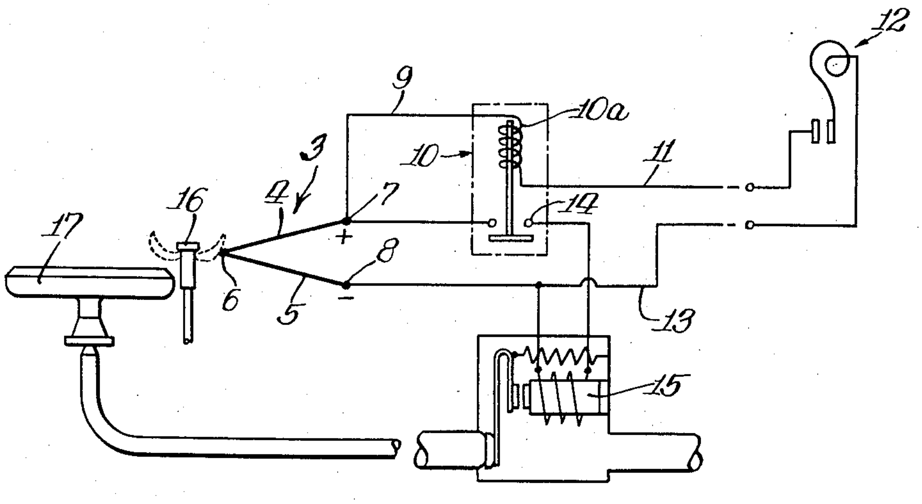
INVENTORS.
Robert W. Fritts,
BY Sebastian Karrer,
Brown, Jackson, Boettcher & Dienner
Att'ys.

United States Patent Office 2,922,082

Patented Jan. 19, 1960

2,922,082

LOW VOLTAGE CONTROL APPARATUS

Robert W. Fritts, Elm Grove, Wis., and Sebastian Karrer, Port Republic, Md., assignors, by mesne assignments, to Minnesota Mining and Manufacturing Company, St. Paul, Minn., a corporation of Delaware Application July 12, 1954, Serial No. 442,658

2 Claims. (Cl. 317—133.5)

This invention relates to apparatus for control of low power circuits, and more particularly to apparatus embodying control means capable of being remotely located from the source of energy for such circuits.

As is well known in the art, thermoelectric generators are devices capable of generating only relatively low voltages (ordinarily less than one volt) and when used as a source of electrical power for operation of electrical devices, must be employed in circuits of relatively low resistance to afford the operated device a practical amount of electrical power. Since maximum output by a thermoelectric generator is realized only when the internal resistance of the thermoelectric generator (which in a thermoelectric generator capable of high power output is very low) is matched to the resistance of a load circuit, it follows that such load circuits and any load devices incorporated therein must of necessity also be of low resistance. From a practical standpoint this requires that the circuit wires transmitting power from the generator to the load device must be short lest the resistance of the circuit wires be unduly high with respect to the internal resistance of a thermoelectric generator. Accordingly, so far as we are aware, it has not heretofore been feasible to control remotely a load device disposed in a thermoelectric circuit from any appreciable distance without the excessive loss of power in the leads running to such remotely located control.

Accordingly, it is an object of our invention to provide control apparatus having a thermoelectric generator as a source of electrical energy, a load device powered from the source of thermoelectric energy, and control means capable of being located remote from such source of thermoelectric energy for controlling energization of the load device.

Another object is to provide control apparatus for controlling a load device powered from a thermoelectric source of electrical energy without excessive power loss in leads running to the remote control means and thereby afford more power at the load device.

Another object is to provide control apparatus having a thermoelectric generator as a source of electrical energy, circuit means including a load circuit powered by such source of electrical energy, and remotely located control means which requires substantially less current for its energization than that of the load circuit.

Another object is to provide circuit means having a thermoelectric generator as a source of electrical energy therefor, which circuit means provides for first impressing the full output of the generator upon remotely located control means, and switching means controlled thereby, and thereafter dividing the output of the generator between a holding circuit for said switching means and a power circuit including a load device to be controlled.

Another object of our invention is to provide circuit means having as its source of electrical power a thermoelectric generator or the like, which circuit means includes a control circuit having remotely located control means, and a power circuit including a load device, and means controlled by the control means controlling the power circuit.

Another object of our invention is to provide control apparatus having a thermoelectric generator as a source of electrical energy, circuit means including a power circuit including a load device, and a control circuit including remotely located control means effective for controlling energization of the load device of the power circuit, and in which the circuit means is so arranged as to deenergize the load device of the power circuit upon mechanical failure of any portion of either of the power and control circuits of the circuit means.

Another object is to provide control apparatus having a thermoelectric generator as a source of electrical energy, circuit means including a power circuit having a load device therein of a resistance approximately matching that of the source of electrical energy for maximum utilization of such energy, and a control circuit including control means for controlling energization of the power circuit affording fast interruption of the power circuit upon cessation of the thermal source of the thermoelectric generator.

Another object is to provide control apparatus as last aforementioned characterized by the control means in the control circuit having small current differential between the current value effective to maintain the power circuit and the current value at which the latter is deenergized, thereby providing high drop-out sensitivity of said load device upon failure of the thermal source for the thermoelectric generator.

Another object is to provide control apparatus powered from a thermoelectric generator having means including higher resistance control circuit means including remotely located control means, and low resistance power circuit means including a load device located closer to the generator, and means in the control circuit means for effecting energization of the low resistance power circuit means responsive to the remotely located control means.

A further object is to provide control apparatus as last aforementioned in which the higher resistance circuit means is shunted concurrently with energization of the low resistance power circuit means, and in which the remotely located control means is effective for controlling continued energization of both high and low resistance circuit means.

A further object of our invention is to provide apparatus in accordance with the several aforementioned objects embodying a thermoelectric generator comprising at least one semi-metallic thermoelectric element of the character hereinafter described.

Other objects and advantages will be hereinafter described or will be apparent to those skilled in the art.

Now, in order to acquaint those skilled in the art with manner of utilizing and practicing the present invention, there is described below in connection with the accompanying drawing a preferred embodiment of the invention.

The single figure of the drawing is a schematic illustration of an embodiment of the invention illustrating the application thereof to the control of fluid fuel-burning apparatus.

In the drawing the thermoelectric generator 3, therein shown, comprises thermoelectric elements 4 and 5 made of suitable thermoelectric materials joined together at one of their ends, as at 6, to form a hot junction, subject to a source of heat, such as the flame of pilot burner 16, conventionally employed in connection with gas burning apparatus. It will be understood that in lieu of the simple thermocouple shown in the drawing, a plurality of thermocouples arranged in any manner known in the art may be utilized. The other ends of the elements 4 and 5 are connected to circuit wires hereinafter described to afford the thermoelectric generator cold junctions or terminals as at 7 and 8.

The thermoelectric generator 3 comprises a first element 4 and a second element 5 of thermoelectric materials separated from each other in the thermoelectric series. One or both of these thermoelectric elements, in accordance with the present invention, may be made of "semi-metallic alloys" which will be understood, as hereinafter employed throughout this specification and in the appended claims, as meaning an alloy having high thermoelectric power, nominally higher electrical resistivity and low thermal conductivity with respect of like characteristics ordinarily exhibited by metals. Such semi-metallic elements may, when placed in a temperature gradient, afford either positive or negative Seebeck E.M.F. and will accordingly be denominated respectively positive and negative elements. One or both of the elements 4 and 5 may be of the aforementioned semi-metallic alloys and, when so utilized, they must be of opposite polarity in the apparatus shown. Alternatively, one of the elements may be a semi-metallic alloy (either positive or negative) and the other may be any suitable dissimilar thermoelectric element, and more specifically, a metallic element, preferably stainless steel.

Examples of suitable semi-metallic elements are as follows: the positive and negative copper-silver-selenium alloys disclosed in the patent to Milnes, No. 2,232,960; the positive and negative copper-silver-tellurium-selenium-sulphur alloys disclosed in the Schwarz patent, No. 2,397,756, or the positive and negative silver-tellurium alloys disclosed in the patent to Faus, No. 2,602,095. Further examples of suitable semi-metallic alloys are disclosed in our Patent No. 2,811,571, dated October 29, 1957.

The thermoelectric generator 3 may thus comprise any of the aforementioned negative semi-metallic alloys and any of the aforementioned positive semi-metallic alloys as one of the thermoelectric elements 4 and 5, the other of such elements being any known metallic thermoelectric element, preferably stainless steel. Or, the thermoelectric elements 4 and 5 may be any one of the negative semi-metallic alloys aforementioned and positive semi-metallic alloys aforementioned, respectively.

The control apparatus shown in the drawing embodies circuit means including a control circuit defined by a conductor 9 connecting the cold junction 7, a coil 10*a* of a relay 10, a conductor 11 connecting the other side of the coil 10*a* with a remotely located switch illustrated in the drawing as the thermostat 12, and the other side of the thermostat 12 being connected by conductor 13 to the negative terminal 8 of the thermoelectric generator.

It will also be observed that the circuit means of the apparatus further embodies a power circuit connected in parallel with the aforedescribed control circuit across the terminals 7 and 8 of the thermoelectric generator. This power circuit includes a set of contacts 14 under the control of relay 10 and the coil 15 of a load device, such as a main gas control valve for controlling flow of fluid to main burner 17 in juxtaposition of pilot burner 16. The power circuit is of low resistance compared with the control circuit already described.

In operation, when the contacts of the remotely located thermostat 12 are closed, the entire voltage of the thermoelectric generator is impressed across the control circuit, thereby energizing the relay 10 and effecting closing of its contacts 14. When the contacts of the relay are closed, the power circuit aforedescribed is closed and the current flow in the control circuit is reduced to a point merely sufficient to hold in the relay 10 while the major portion of the output of the thermoelectric generator flows through the power circuit for energization of the load device 15 to admit fuel to the main burner 17 where it is ignited by the flame of the pilot burner 16. Thus, the apparatus of our invention may be denominated generally as an apparatus in which the flow of electrical power in low resistance power circuit can be controlled by the expenditure of small amounts of power in a remotely located control device.

It will be observed that the power developed by thermocouple elements 4 and 5 is first impressed in full amount across a higher resistance circuit comprising the lead 9, the relay 10, lead 11, thermostat 12, and lead 13. Upon closing of this circuit and energization of relay 10 contacts 14 are closed by the armature relay 10 and the load device 15 is placed in shunt across the terminals 7 and 8 of the generator. Thus, upon energization of the load device 15 a minor portion of the output of the thermoelectric generator flows through the energizing coil 10*a* of the relay 10 in the high resistance control circuit, but such power is sufficient to hold the relay 10 in (i.e. contacts 14 closed) since, as is well known in the art, fewer ampere turns are required for holding such electromagnetic device in than are required initially for attracting the armature of the device to close initially contacts 14. Also, as is known, devices such as relay 10 may embody means for adjusting the drop-out current characteristic thereof and such form of relay may here be used, if desired, to provide for such adjustment. Examples of such adjusting means are, for example, adjustable resistances in the control circuit, or adjustment means for changing the loading on the spring or other biasing means associated with the armature of the relay.

It will be observed that with a load device in the form of electro-magnetically operated valve 15 for control of fluid fuel to the main burner 17, such an electro-magnetically operated valve will be operated directly and electrically from the source of electrical energy as small as that afforded by a thermoelectric generator, while at the same time being maintained under control of a remotely located thermostat responsive to the temperature of the space heated by the burning of fuel at the main burner 17. At the same time, the apparatus provides a safety shut off function in that should the pilot burner 16 fail for any reason and thus be unavailable for ignition of the fluid fuel issuing from the burner 17, the electro-magnetically operated valve of the load device 15 will be maintained and returned promptly by biasing means, conventionally embodied therein to flow-preventing position thereby rendering impossible an accumulation of fluid fuel at the burner 17 unless the ignition means or pilot burner 16 therefor is operative. Similarly, if any portion of the electrical circuit aforedescribed should for any reason fail, the electro-magnetically operated valve 15 will similarly be maintained in flow-preventing position. It is to be observed that by virtue of the reduced current flow in the control circuit for holding the relay 10 in, as previously mentioned, quick drop-out is afforded on failure of the pilot flame since the current value will immediately drop below that required to hold the relay in.

From the foregoing, it will be seen that the control apparatus affords means for remotely controlling a load device powered from a thermoelectric source of electrical energy or the like without excessive power loss in leads running to the remote control, thereby affording more power at the load device. More specifically, it will be observed that the power to operate the load device is not required to travel through the control circuit including the remotely located control device but rather is supplied through a low resistance circuit having short leads which are located close to the thermoelectric generator, thereby rendering current supply to the load device independent of the resistance of the remotely located control means and the leads running thereto as aforementioned.

As previously mentioned, mechanical and electrical connection is made to the cold junction terminals 7 and 8 of the thermoelectric generator. The terminal connections for the elements should preferably be of low thermal and electrical resistance and chemically stable with respect to the element.

It has been discovered, as disclosed and claimed in the Russell E. Fredrick, Robert W. Fritts and William V, Huck Patent No. 2,811,569, dated October 29, 1957, that for thermoelectric elements of the character under consideration, that contact electrodes comprising iron or certain iron alloys afford contacts of the aforementioned characteristics. The contacts may be applied by mere pressure in all cases with respect of the lead-tellurium, lead-tellurium-selenium, and promoted lead-tellurium alloys or compositions, or may be bonded to negative elements of the aforementioned lead-tellurium, lead-tellurium-selenium alloys or compositions, and the positive and negative promoted lead-tellurium alloys and compositions.

Suitable contact electrodes for the other semi-metallic thermoelectric elements; that is, those disclosed in the aforementioned patents to Milnes, Schwartz and Faus, are disclosed in those patents respectively, or will be obvious to those skilled in the art. Where the thermoelectric elements are of suitable known metallic materials no contacting problem is encountered.

It should be further observed that elements 4 and 5 of the generator, when constructed of semi-metallic alloys, should be shielded from ambient atmosphere and to this end the device should be hermetically sealed. Also, such elements 4 and 5 normally are quite fragile and care should be exercised in the mounting thereof to protect them from undue tensile strains and shock. Any suitable structure may be utilized for the purposes noted.

It is to be understood, that the embodiment aforedescribed is to be considered as illustrative only, reference being made to the appended claims for delineation of the scope of the invention.

We claim:

1. Control apparatus comprising, a thermoelectric generator having predetermined output capacity, an electroresponsive control device having a predetermined pull-in current requirement, a first circuit connecting said control device to said generator, the resistance of said circuit being sufficiently low to permit said predetermined output capacity of said generator to supply current to said control device in quantity greater than the pull-in current requirement of said device, a condition responsive circuit controlling device having contacts movable between circuit interrupting and circuit making position, electrical connections extending from said generator to said circuit controlling device and having a resistance which if included in said first circuit would reduce the current available to said electroresponsive control device from said generator to below the pull-in current requirement thereof, and means permitting control of said electroresponsive control device by said condition responsive circuit controlling device, said means comprising a relay having normally open contacts in said first circuit in series with said electroresponsive control device and said generator, said relay also having an electroresponsive operator having predetermined pull-in and drop-out current requirements connected in series circuit with said generator, connections and circuit controlling device, the resistance of said last-mentioned series circuit when the contacts of said circuit controlling device are in circuit-making position being of a value permitting initial current flow therethrough from said generator to said operator in quantity greater than the pull-in current requirement of said operator to effect pull-in of said relay and closure of said contacts for division of said predetermined output of said generator between said first circuit and said last-mentioned series circuit, the resistance of said first and last-mentioned circuits when both of said sets of contacts are in circuit making position being such as to permit simultaneous current flow from said generator to said electroresponsive control device in quantity at least equal to the pull-in current value thereof and to said relay operator in quantity greater than the drop-out current value thereof.

2. Control apparatus for fluid fuel burning apparatus comprising, a thermoelectric generator having predetermined output capacity, a direct acting electroresponsive main burner fuel valve disposed in proximity to said generator and having a predetermined pull-in current requirement, a first circuit connecting said valve to said generator, the resistance of said circuit being sufficiently low to permit said predetermined output capacity of said generator to supply current to said valve in quantity greater than the pull-in current requirement of said valve, a thermostat located remote from said generator and fuel valve, electrical connections extending from said generator to said thermostat and having a resistance which if included in said first circuit would reduce the current available to said valve from said generator to below the pull-in current requirement thereof, and means permitting control of said valve by said remote thermostat, said means comprising a relay having normally open contacts in said first circuit in series with said valve and generator, said relay also having an electroresponsive operator having predetermined pull-in and drop-out current requirements connected in series circuit with said generator, connections and thermostat, the resistance of said last-mentioned series circuit when the contacts of said thermostat are closed being of a value permitting initial current flow therethrough from said generator to said operator in quantity greater than the pull-in current requirement of said operator to effect pull-in of said relay and closure of said contacts for division of said predetermined output of said generator between said first circuit and said last-mentioned series circuit, the resistance of said first and last-mentioned circuits when said thermostat and relay contacts are closed being such as to permit simultaneous current flow from said generator to said valve in quantity at least equal to the pull-in current value thereof and to said relay operator in quantity below the pull-in and just above the drop-out current value thereof.

References Cited in the file of this patent

UNITED STATES PATENTS

| | | |
|---|---|---|
| 2,084,654 | Ray | June 22, 1937 |
| 2,237,578 | Ray | Apr. 8, 1941 |
| 2,268,960 | Ray | Jan. 6, 1942 |
| 2,292,478 | Ray | Aug. 11, 1942 |
| 2,294,694 | Ray | Sept. 1, 1942 |
| 2,383,676 | Paille | Aug. 28, 1945 |
| 2,464,945 | Rouse | Mar. 22, 1948 |
| 2,615,511 | Ray | Oct. 28, 1952 |
| 2,691,707 | Lovejoy | Oct. 12, 1954 |